(12) United States Patent
Kochersperger

(10) Patent No.: US 9,083,227 B2
(45) Date of Patent: Jul. 14, 2015

(54) LINEAR MOTOR AND LITHOGRAPHY ARRANGEMENT INCLUDING LINEAR MOTOR

(75) Inventor: Peter C. Kochersperger, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 569 days.

(21) Appl. No.: 13/473,547

(22) Filed: May 16, 2012

(65) Prior Publication Data

US 2013/0063711 A1 Mar. 14, 2013

Related U.S. Application Data

(60) Provisional application No. 61/532,886, filed on Sep. 9, 2011.

(51) Int. Cl.
| | |
|---|---|
| *G03B 27/72* | (2006.01) |
| *G03B 27/54* | (2006.01) |
| *H02K 41/03* | (2006.01) |
| *G05B 19/402* | (2006.01) |
| *H02P 25/06* | (2006.01) |
| *G03F 7/20* | (2006.01) |

(52) U.S. Cl.
CPC ............ *H02K 41/03* (2013.01); *G03F 7/70075* (2013.01); *G03F 7/70191* (2013.01); *G03F 7/70825* (2013.01); *G05B 19/402* (2013.01); *H02P 25/06* (2013.01); *G05B 2219/42231* (2013.01); *H02K 2201/18* (2013.01)

(58) Field of Classification Search
CPC .................................................. G03F 7/70825
USPC ...................... 355/67–71; 310/90.5, 110, 112
See application file for complete search history.

(56) References Cited

U.S. PATENT DOCUMENTS

| | | | |
|---|---|---|---|
| 8,629,973 B2 * | 1/2014 | Zimmerman et al. | .......... 355/71 |
| 2003/0038552 A1 * | 2/2003 | Setiawan et al. | ............. 310/90.5 |

(Continued)

FOREIGN PATENT DOCUMENTS

| | | |
|---|---|---|
| CN | 101719712 A | 6/2010 |
| CN | 101814819 A | 8/2010 |

(Continued)

OTHER PUBLICATIONS

English-Language Abstract for Japanese Patent Publication No. 2001-008434 A, published Jan. 12, 2001; 1 page.

(Continued)

*Primary Examiner* — Hung Henry Nguyen
(74) *Attorney, Agent, or Firm* — Sterne, Kessler, Goldstein & Fox P.L.L.C

(57) ABSTRACT

A lithographic apparatus including a uniformity correction system is disclosed. The lithographic apparatus comprises an illumination system configured to condition a beam of radiation. The illumination system comprises a uniformity correction system located at a plane configured to receive a substantially constant pupil when illuminated with the beam of radiation. The uniformity correction system includes fingers configured to be movable into and out of intersection with a radiation beam so as to correct an intensity of respective portions of the radiation beam. A linear motor actuator arrangement drives the fingers to their respective appropriate positions to compensate for non-uniform illumination. Control is provided by a control system that precisely manipulates carriers of the fingers.

13 Claims, 10 Drawing Sheets

(56) References Cited

U.S. PATENT DOCUMENTS

| | | |
|---|---|---|
| 2004/0207271 A1 | 10/2004 | Korenaga et al. |
| 2004/0239911 A1 | 12/2004 | Carter et al. |
| 2006/0114439 A1 | 6/2006 | Muijderman et al. |
| 2007/0057595 A1 | 3/2007 | Corredoura |
| 2009/0079284 A1* | 3/2009 | Onuma et al. ............... 310/90.5 |
| 2010/0302525 A1 | 12/2010 | Zimmerman et al. |
| 2011/0017926 A1 | 1/2011 | Lee et al. |

FOREIGN PATENT DOCUMENTS

| | | |
|---|---|---|
| CN | 102157310 A | 8/2011 |
| JP | 2001-008434 A | 1/2001 |
| WO | WO 01-87663 A1 | 11/2001 |

OTHER PUBLICATIONS

English Language Abstract for Chinese Patent Publication No. 101719712 A, published Jun. 2, 2010; 1 page.

English-Language Abstract for Chinese Patent Publication No. 101814819 A, published Aug. 25, 2010; 1 page.

English-Language Abstract for Chinese Patent Publication No. 102157310 A, published Aug. 17, 2011; 1 page.

* cited by examiner

LINEAR MOTOR AND LITHOGRAPHY ARRANGEMENT INCLUDING LINEAR MOTOR

CROSS REFERENCE TO RELATED APPLICATIONS

This application claims the benefit under 35 U.S.C. §119 (e) to U.S. Provisional Patent Application No. 61/532,886, filed Sep. 9, 2011, which is incorporated by reference herein in its entirety.

BACKGROUND

1. Field of Invention

The invention relates to a lithographic apparatus and illumination uniformity correction system. The present invention generally relates to lithography and more particularly to correcting for illumination irregularities so as to produce a uniform beam in a cross scan direction during lithography of an integrated circuit.

2. Related Art

A lithographic apparatus is a machine that applies a desired pattern onto a target portion of a substrate. The lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

A lithographic apparatus typically includes an illumination system, which is arranged to condition radiation generated by a radiation source before the radiation is incident upon a patterning device. The illumination system may, for example, modify one or more properties of the radiation, such as polarization and/or illumination mode. The illumination system may include a uniformity correction system, which is arranged to correct or reduce non-uniformities, e.g., intensity non-uniformities, present in the radiation. The uniformity correction devices may employ actuated fingers which are inserted into an edge of a radiation beam to correct intensity variations. However, a width of a spatial period of intensity variation that can be corrected is dependent on a size of an actuating device used to move fingers of the uniformity correction system. Furthermore, in some instances, if a size or shape of the fingers used to correct irregularities of a radiation beam is modified, then the uniformity correction system may compromise or modify in an unwanted manner one or more properties of the radiation beam, such as a pupil formed by the radiation beam.

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon substrate). Transfer of the pattern is typically via imaging onto a layer of radiation-sensitive material (e.g., resist) provided on the substrate. In general, a single substrate contains a network of adjacent target portions that are successively patterned. To reduce manufacturing cost of ICs, it is customary to expose multiple substrates of each IC. Likewise, it is also customary that the lithographic apparatus is in almost constant use. That is, in order to keep manufacturing cost of all types of ICs at a potential minimum, the idle time between substrate exposures is also minimized. As a result, the lithographic apparatus absorbs heat which causes expansion of the apparatus's components leading to drift, movement, and uniformity changes.

In order to ensure good imaging quality on the patterning device and the substrate, it is beneficial to minimize or eliminate illumination irregularities. One way that this is carried out is by inserting "fingers" into an illumination beam at appropriate places to even out illumination. Various electro-mechanical sub-systems arrangements are utilized or proposed to manipulate the fingers into the appropriate positions for beam scanning and to move those fingers out of the beam path when they are not needed.

The market demands that sub-systems for manipulating the positions of fingers reliably operate in the environment of a lithography device so that the lithographic apparatus can perform lithography processes as efficiently as possible to maximize manufacturing capacity and keep manufacturing costs per device and maintenance low.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses with uniformity compensators and associated sensors.

Figure 1A:
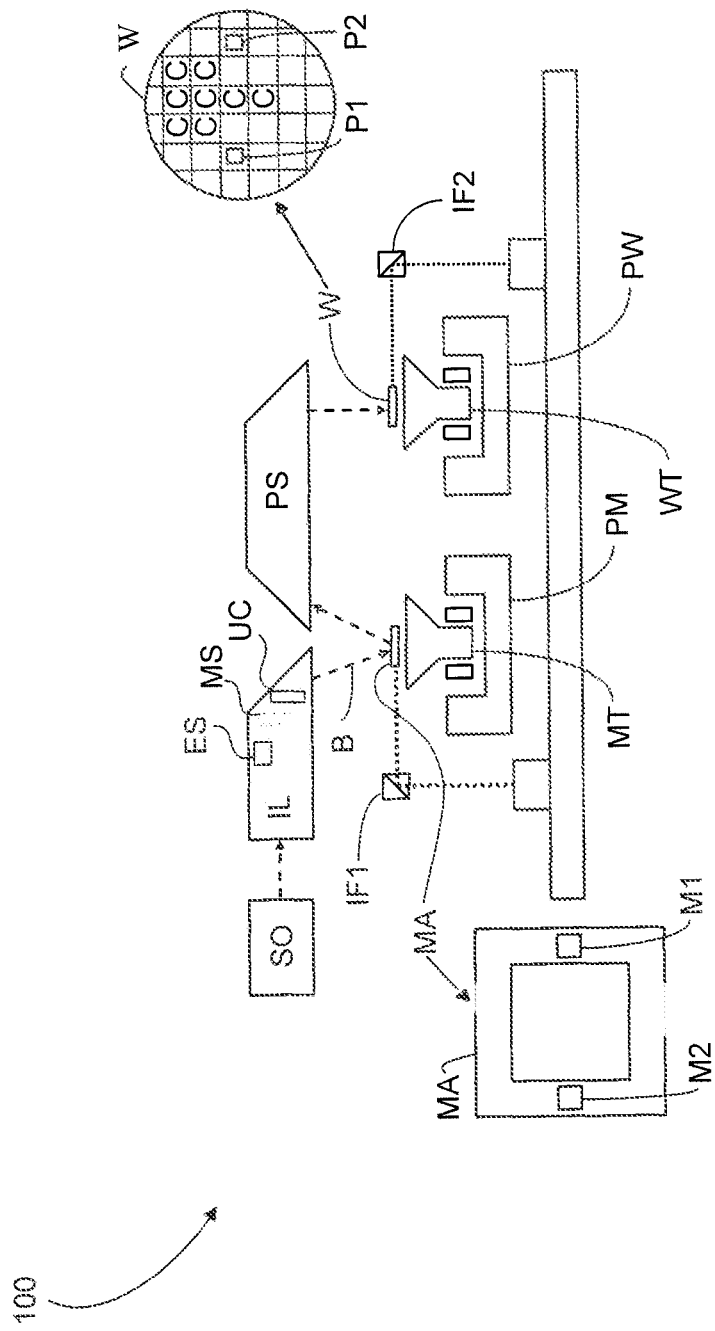

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The invention is directed to correction of illumination irregularities in a lithography apparatus. It is particularly useful in a EUV lithography device. Embodiments of the invention are directed to linear motors (actuators) forming part of an illumination irregularity correction (IIC) sub-system for correcting illumination irregularities and to a control system for operating the IIC sub-system. Embodiments of the IIC sub-system utilize an arrangement that does not require a large number of magnets as required by other IIC sub-systems. This portion of this patent document describes embodiments of the invention that incorporate features of the invention. The described embodiments are examples of the invention. The scope of the invention is not limited to the described embodiment(s). The invention is defined by the claims appended hereto.

The embodiments described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Before describing embodiments in more detail, it is instructive to present an example environment in which embodiments of the present invention may be implemented.

I. An Example Lithographic Environment

A. Example Reflective and Transmissive Lithographic Systems

Figure 1B:
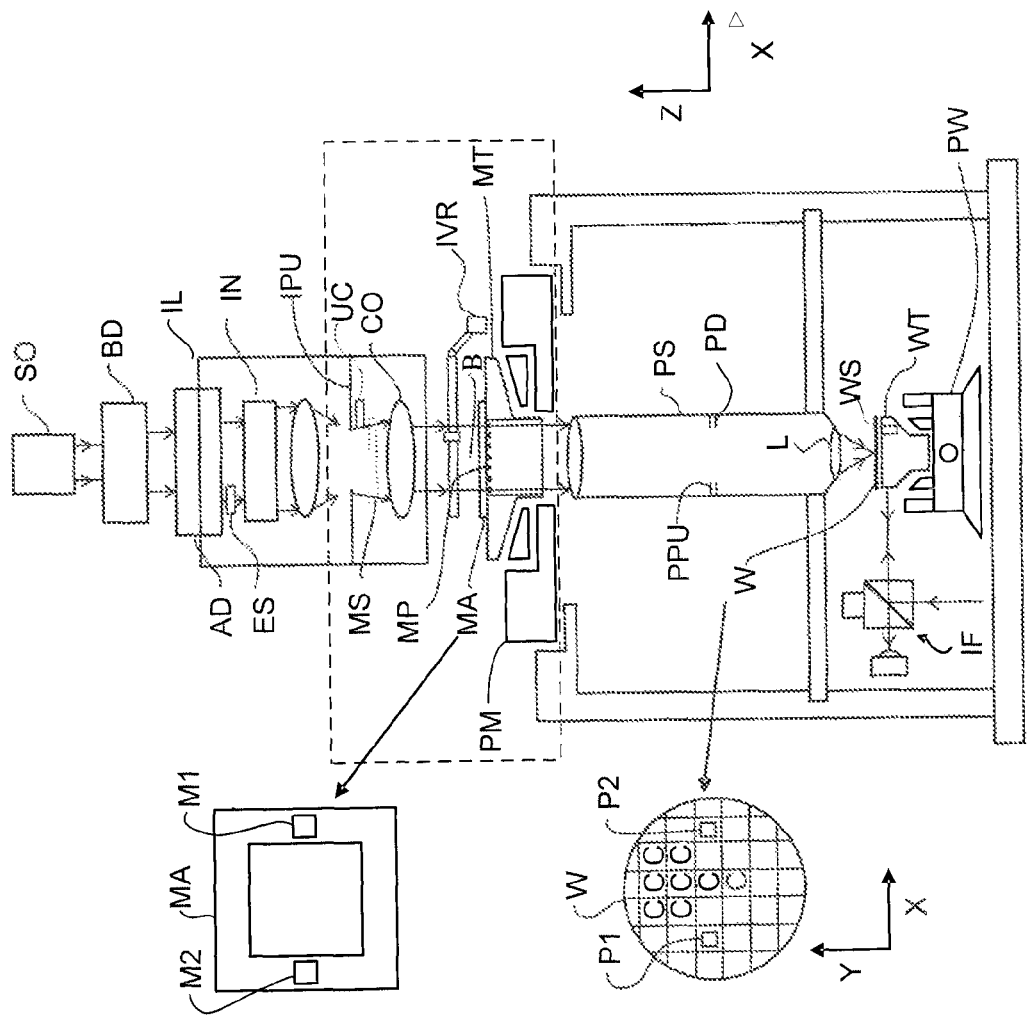

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a substrate table) WT configured to hold a substrate (e.g., a resist coated substrate) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic, or other types of optical components, or any combination thereof, for directing, shaping, or controlling the radiation B. The illumination system IL may also include an energy sensor ES that provides a measurement of the energy (per pulse), a measurement sensor MS for measuring the movement of the optical beam, and uniformity compensators UC that allow the illumination slit uniformity to be controlled.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stages" machines the additional substrate tables WT may be used in parallel or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example, when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section. This desired uniformity is may be maintained through the use of the energy sensors ES that divides-out the variation of the source output and the uniformity compensator UC that is comprised of a plurality of protrusions (e.g., fingers) that can be inserted into and removed from the illumination beam to modify its uniformity and intensity.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan. Likewise, in FIG. 2 there is a substrate stage slit sensor WS that on a per pulse basis in conjunction with the energy sensor ES produces normalized intensity data from the illumination system IL to the substrate W.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
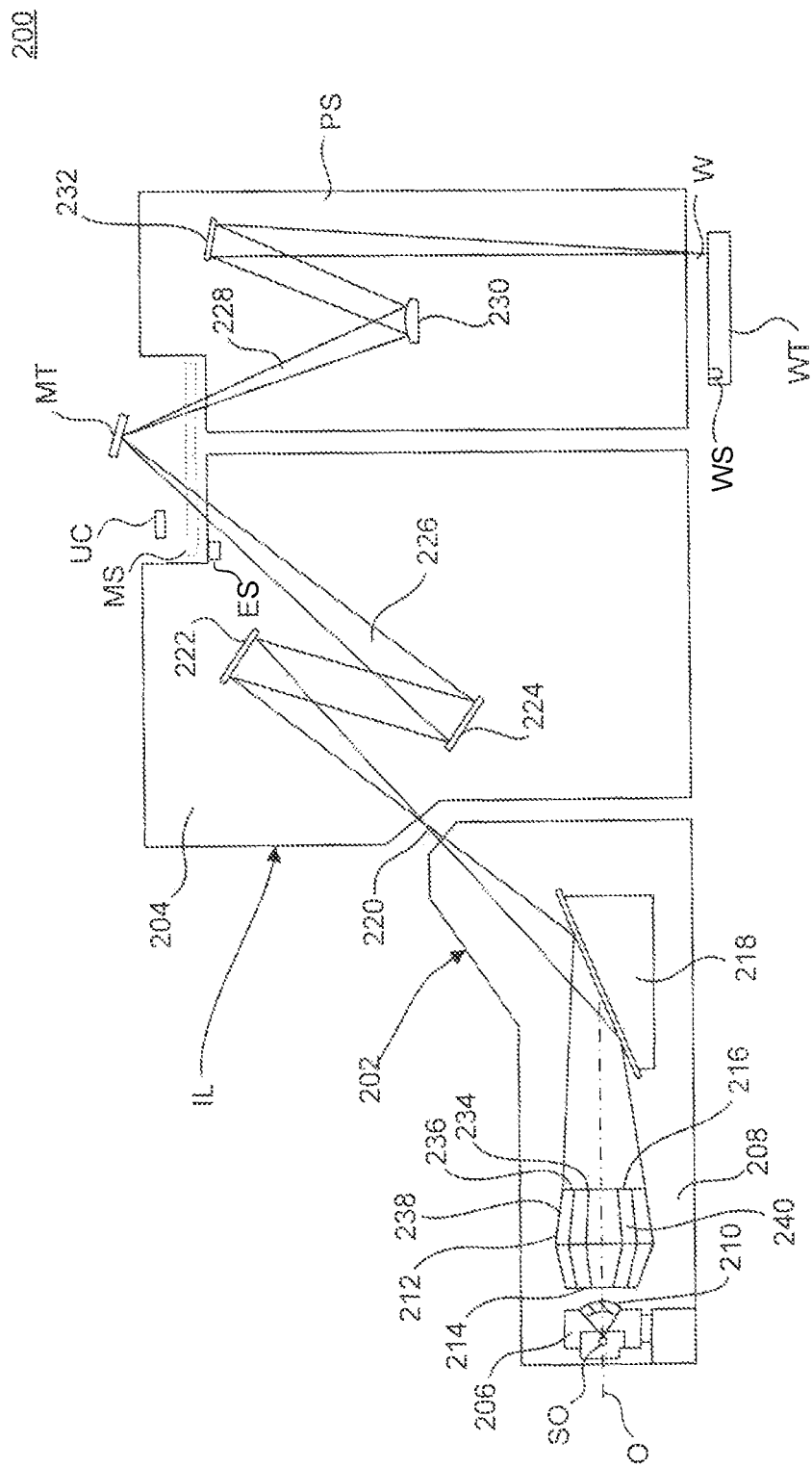
FIG. 2 is a schematic diagram of an example extreme ultra violet (EUV) lithographic apparatus.

FIG. 2 schematically depicts an exemplary EUV lithographic apparatus according to an embodiment of the present invention. In FIG. 2, EUV lithographic apparatus includes a radiation system 202, an illumination optics unit 204, and a projection system PS. The radiation system 202 includes a radiation source SO, in which a beam of radiation may be formed by discharge plasma. In an embodiment, EUV radiation may be produced by a gas or vapor, for example, from Xe gas, Li vapor, or Sn vapor, in which very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 206 into a collector chamber 208 via a gas barrier or contaminant trap 210 positioned in or behind an opening in source chamber 206. In an embodiment, gas barrier 210 may include a channel structure.

Collector chamber 208 includes a radiation collector 212 (which may also be called collector mirror or collector) that may be formed from a grazing incidence collector. Radiation collector 212 has an upstream radiation collector side 214 and a downstream radiation collector side 216, and radiation passed by collector 212 can be reflected off a grating spectral filter 218 to be focused at a virtual source point 220 at an aperture in the collector chamber 208. Radiation collectors 212 are known to skilled artisans.

From collector chamber 208, a beam of radiation 226 is reflected in illumination optics unit 204 via normal incidence reflectors 222 and 224 onto a reticle or mask (not shown) positioned on reticle or mask table MT. A patterned beam 228 is formed, which is imaged in projection system PS via reflective elements 230 and 232 onto a substrate (not shown) supported on substrate stage or substrate table WT. In various embodiments, illumination optics unit 204 and projection system PS may include more (or fewer) elements than depicted in FIG. 2. For example, illumination optics unit 204 may also include an energy sensor ES that provides a measurement of the energy (per pulse), a measurement sensor MS for measuring the movement of the optical beam, and uniformity compensators UC that allow the illumination slit uniformity to be controlled. Additionally, grating spectral filter 218 may optionally be present, depending upon the type of lithographic apparatus. Further, in an embodiment, illumination optics unit 204 and projection system PS may include more mirrors than those depicted in FIG. 2. For example, projection system PS may incorporate one to four reflective elements in addition to reflective elements 230 and 232. In FIG. 2, reference number 240 indicates a space between two reflectors, e.g., a space between reflectors 234 and 236.

In an embodiment, collector mirror 212 may also include a normal incidence collector in place of or in addition to a grazing incidence mirror. Further, collector mirror 212, although described in reference to a nested collector with reflectors 234, 236, and 238, is herein further used as example of a collector.

Further, instead of a grating 218, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 212 or optical EUV transmissive filters in illumination unit 204 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus, a first optical elements closer to source SO than a second optical element is configured upstream of the second optical element; the second optical element is configured downstream of the first optical element. For example, collector mirror 212 is configured upstream of spectral filter 218, whereas optical element 222 is configured downstream of spectral filter 218.

All optical elements depicted in FIG. 2 (and additional optical elements not shown in the schematic drawing of this embodiment) may be vulnerable to deposition of contaminants produced by source SO, for example, Sn. Such may be the case for the radiation collector 212 and, if present, the spectral purity filter 218. Hence, a cleaning device may be employed to clean one or more of these optical elements, as well as a cleaning method may be applied to those optical elements, but also to normal incidence reflectors 222 and 224 and reflective elements 230 and 232 or other optical elements, for example additional mirrors, gratings, etc.

Radiation collector 212 can be a grazing incidence collector, and in such an embodiment, collector 212 is aligned along an optical axis O. The source SO, or an image thereof, may also be located along optical axis O. The radiation collector 212 may comprise reflectors 234, 236, and 238 (also known as a "shell" or a Wolter-type reflector including several Wolter-type reflectors). Reflectors 234, 236, and 238 may be nested and rotationally symmetric about optical axis O. In FIG. 2, an inner reflector is indicated by reference number 234, an intermediate reflector is indicated by reference number 236, and an outer reflector is indicated by reference number 238. The radiation collector 212 encloses a certain volume, e.g., a volume within the outer reflector(s) 238. Usually, the volume within outer reflector(s) 238 is circumferentially closed, although small openings may be present.

Reflectors 234, 236, and 238 respectively may include surfaces of which at least a portion represents a reflective layer or a number of reflective layers. Hence, reflectors 234, 236, and 238 (or additional reflectors in the embodiments of radiation collectors having more than three reflectors or shells) are at least partly designed for reflecting and collecting EUV radiation from source SO and at least part of reflectors 234, 236, and 238 may not be designed to reflect and collect EUV radiation. For example, at least part of the back side of the reflectors may not be designed to reflect and collect EUV radiation. On the surface of these reflective layers, there may be in addition a cap layer for protection or as an optical filter provided on at least part of the surface of the reflective layers.

The radiation collector 212 may be placed in the vicinity of the source SO or an image of the source SO. Each reflector 234, 236, and 238 may comprise at least two adjacent reflecting surfaces, the reflecting surfaces further from the source SO being placed at smaller angles to the optical axis O than the reflecting surface that is closer to the source SO. In this way, a grazing incidence collector 212 is configured to generate a beam of EUV radiation propagating along the optical axis O. At least two reflectors may be placed substantially coaxially and extend substantially rotationally symmetric about the optical axis O. It should be appreciated that radiation collector 212 may have further features on the external surface of outer reflector 238 or further features around outer reflector 238, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

II. System and Methods for Illumination Irregularity Compensation (IIC)

Figure 3:
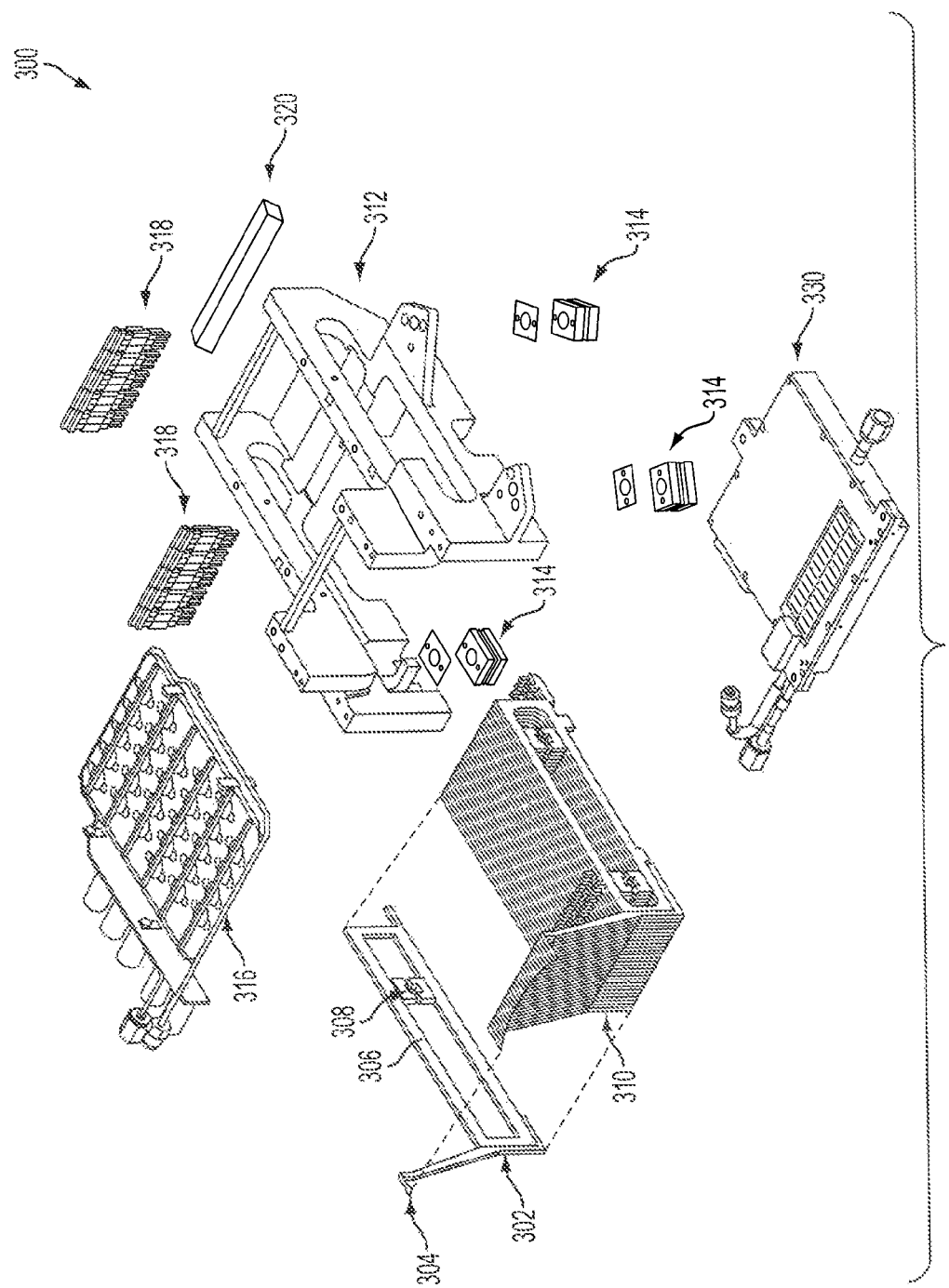
FIG. 3 is an exploded view of a mechanical portion of a IIC sub-system 300 compensator sub-system having "fingers" that are moved into positions within a projected beam to promote uniformity.

FIG. 3 is an exploded view of a mechanical portion of an IIC sub-system 300, according to an embodiment. IIC sub-system 300 has 28 moving fingers 302, each having a fingertip 304, which selectively block a small portion of the illumination beam prior to exposure to correct for illumination irregularities and to provide a uniform beam in the cross scan direction. Each finger 302 is supported by a single finger assembly 306 which includes a magnet 308. The single finger assemblies 306 together form a finger assembly 310. IIC sub-system 300 includes a frame 312 for holding and supporting finger assembly 310 and the rest of the parts of IIC sub-system 300 using mounts 314. A motor coil assembly 316 moves single finger assemblies 306 into proper position to compensate for illumination irregularities as needed and out of the way when not needed. IIC sub-system 300 also includes finger flexures 318 and a finger stop 320 to stop the motion of finger assemblies 306 at extreme positions. An encoder board assembly 330 provides an electrical/mechanical interface for encoding the mechanical position of finger assemblies 306 and provide instructions to motor coil assembly 316.

The configuration of IIC sub-system 300 requires 112 magnets, four for each finger assembly 36. These magnets are made of neodymium iron boron and need to be protected from the H2 environment of an extreme ultra-violet (EUV) scanner to prevent failure of the magnets. Protecting the magnets 308 is difficult to achieve for EUV lithography scanners because the magnets must be maintained within a vacuum. While IIC sub-system 300 operates effectively, the use of 112 magnets per IIC sub-system 300 requires expensive maintenance when any magnet fails because of its complex construction. Each time maintenance is required, a recalibration is required. The motor design also requires a flat coil plate with 28 coils arranged in a common plane. This presents manufacture challenges to achieve the overall flatness and outgassing required. An additional complexity is that IIC sub-system 300 requires the 28 fingers 302 to wrap around the coil plate of motor coil assembly 316. This presents dynamics challenges.

Figure 4:
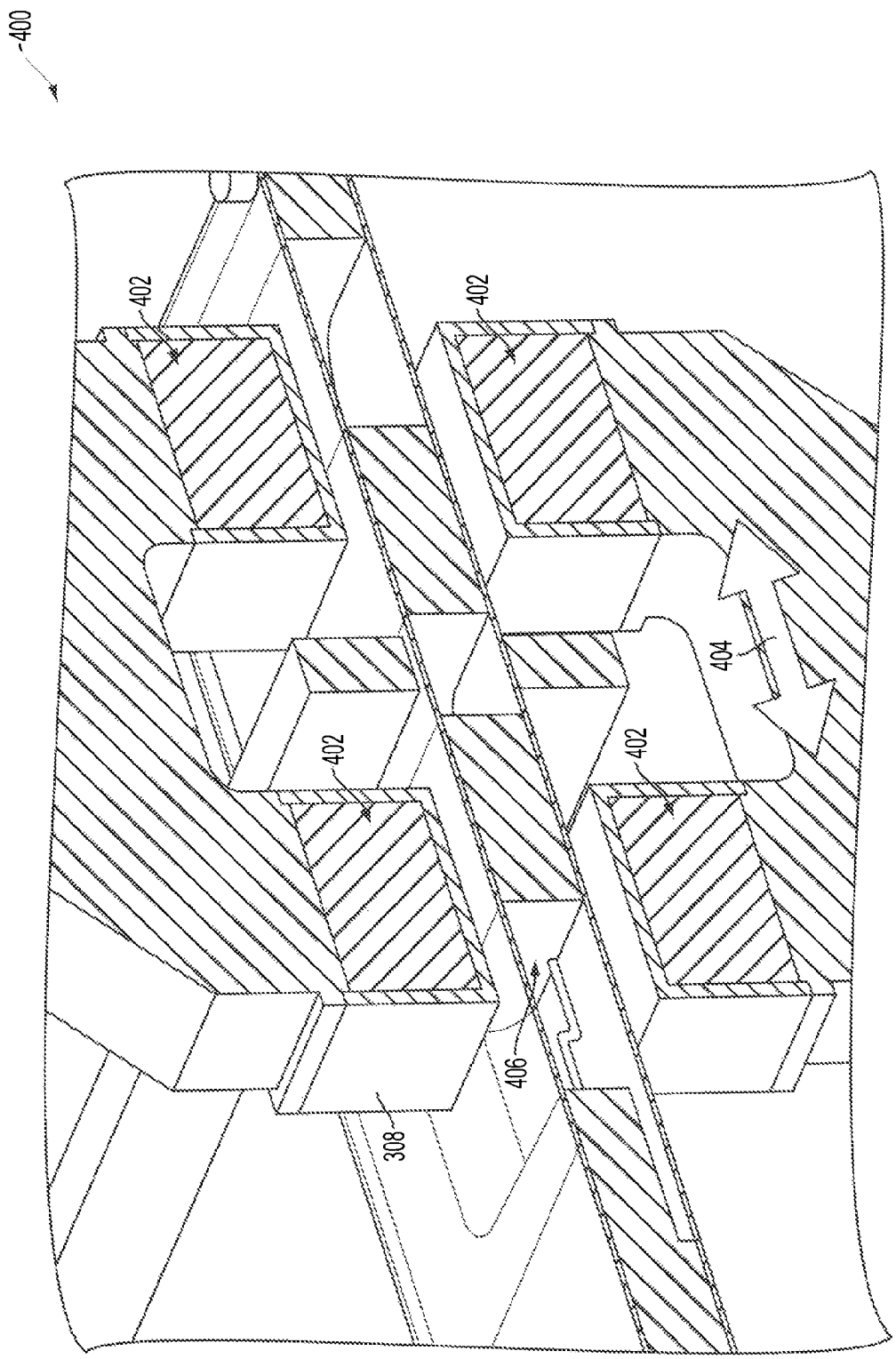
FIG. 4 is a cut-away perspective view of the structure of a portion of the compensator sub-system and indicating directions of movement in use.

FIG. 4 is a cut-away perspective view of the structure of a portion 400 of IIC sub-system 300 shown in FIG. 3. In this cut-away view it is possible to see inner edges 402 of four magnets 308. The direction of travel of portion 400 is indicated by arrow 404. Coils of motor coil assembly 316 are indicated by 406. A direction of travel is indicated by arrow 408.

Figure 5:
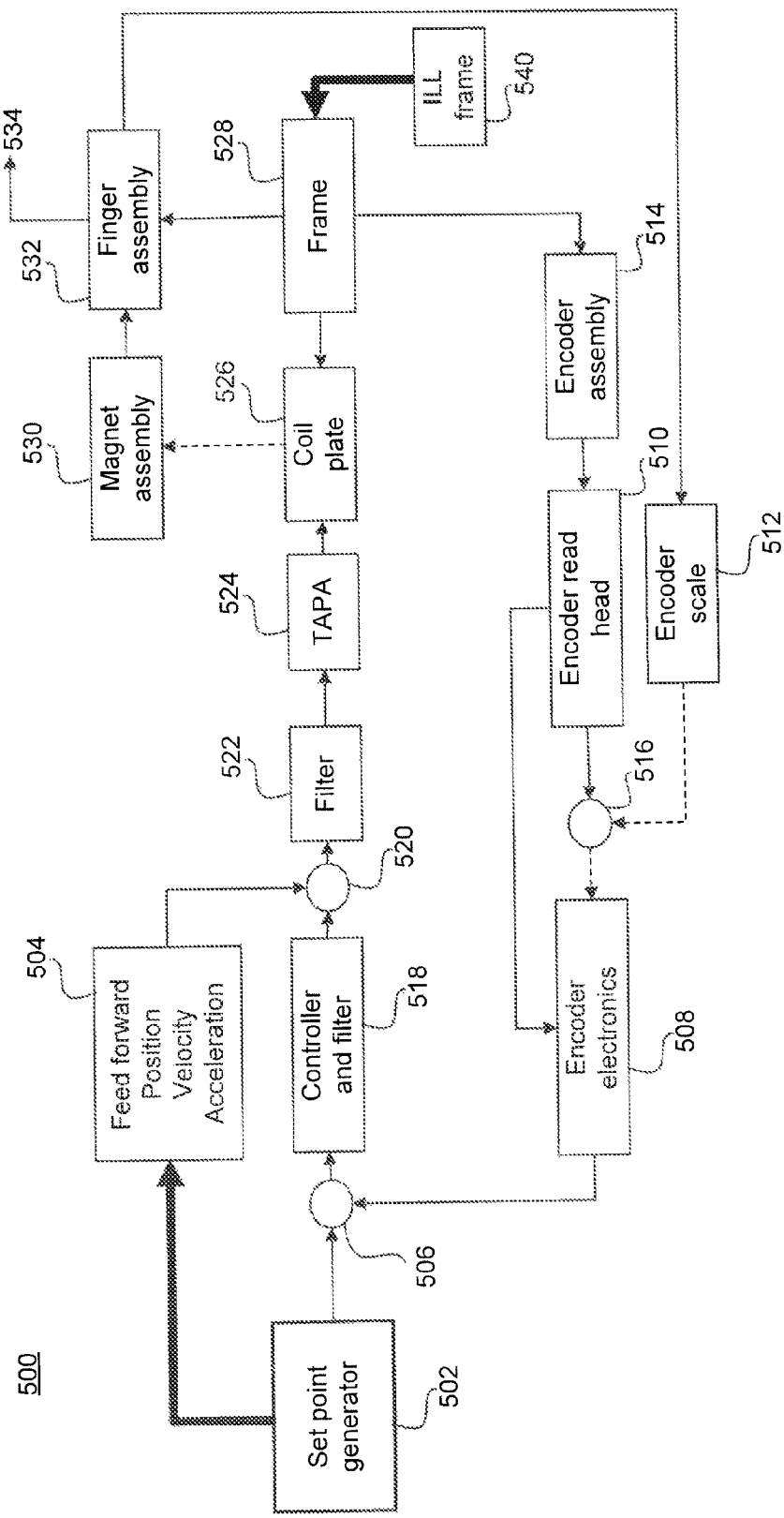
FIG. 5 is a block diagram of a control system for operating the compensator sub-system shown in FIGS. 3 and 4.

FIG. 5 is a block diagram of a servo control system 500 for operating IIC sub-system 300 shown in FIGS. 3 and 4. Physical connections or software relations are indicated by a solid line arrow. Virtual relations are indicated by a dotted line arrow. A set point generator 502 sets a desired finger position and sends a signal carrying that information to a feed forward position velocity acceleration block 504. Set point generator 502 also sends a similar signal to a comparator 506, which compares it with a signal representing an actual finger position from encoder electronics 508. Encoder electronics 508 is mounted on an encoder head 510 and reads relative position between encoder head 510 and an encoder scale 512. Encoder read head 510 receives its control signal from an encoder assembly 514. A comparator 516 receives inputs from encoder read head 510 and encoder scale 512 and provides a signal to encoder electronics 508.

An output signal 506 from comparator 516 is coupled to a controller and filter 518. A further comparator 520 compares an output of control and filter 518 with an output of feed forward position velocity acceleration block 504 and provides a signal to a filter 522. An output of filter 522 is coupled to a TAPA 524 which, in turn, provides a control signal to coil plate 526. Coil plate 526 also receives an input from a Unicom NXE frame 528 and provides control to a magnet assembly 530. Unicom NXE frame 528 also provides a signal to encoder assembly 514 and to a finger assembly 532. Finger assembly 532 is also controlled by magnet assembly 530 and, in turn, provides an output 534 indicating fingertip position. An ILL frame 540 provides input to Unicom NXE frame 528. Encoder scale 512 receives input from finger assembly 534.

The market demands that sub-systems for manipulating the positions of fingers reliably operate in the environment of a lithography device so that the lithographic apparatus can perform lithography processes as efficiently as possible to maximize manufacturing capacity and keep costs per device and maintenance low. The present invention provides various apparatus, methods and arrangements that can be used to satisfy this market demand.

An embodiment of the invention is a lithographic apparatus. An illumination system is configured to condition a beam of radiation. A support structure is configured to hold a patterning device which is configured and arranged to pattern the conditioned beam of radiation. A substrate table is configured and arranged to hold a substrate on which a lithographic process is to be carried out. A projection system projects a patterned radiation beam onto a target portion of the substrate. An illumination irregularity correction system is located in a plane and is configured to receive a substantially constant pupil when illuminated with the beam of radiation. Fingers of the uniformity correction system are configured and arranged to be movable into and out of intersection with a radiation beam so as to correct an intensity of respective portions of the radiation beam. Actuating devices are coupled to corresponding ones of the fingers and are configured to move the corresponding fingers. An actuation device includes a fixed stator having first, second and third poles disposed on a plane in a spatial sequence. The first and third poles have a coil wound thereon. The actuation device also includes a rotor having fourth and fifth poles disposed in the plane. The rotor is constructed and arranged to be linearly movable in two dimensions when the first, second and third poles of the fixed stator become energized in response to the coils wound on the first and third poles being energized in a temporal sequence. The fourth and fifth poles are disposed opposite the first, second and third poles and the fixed stator is constructed and arranged to be fixed relative to the rotor. The rotor can be constructed and arranged to position at least one finger of the fingers in response to adjusting of a current in each of the coils in micro steps. Current in each coil can be adjusted with sine cosine microstepping. The fixed stator can be made of iron. The rotor can also be made of iron.

The lithography system can further include a servo control system constructed and arranged to control the actuating devices. The servo control system includes a module constructed and arranged to set a desired position of a finger. Another module is constructed and arranged to sense a present position of the finger. Another module is constructed and arranged to generate currents appropriate to control the position of the finger such that it is positioned at the desired position.

Another embodiment of the invention provides a linear switched reluctance motor. A stator of the motor has a fixed coil arrangement, the stator including at least three poles disposed on a plane in a spatial sequence. A rotor of the motor includes at least two poles disposed in the plane, the rotor being constructed and arranged to be linearly movable in two dimensions by the fixed coil arrangement. The stator is constructed and arranged to remain stationary relative to the rotor. The two rotor poles are disposed opposite the three stator poles. The fixed coil arrangement can include windings on each of at least two poles of the stator.

An embodiment of the invention provides a linear switched reluctance motor. A fixed stator of the motor including first, second and third poles disposed on a plane in a spatial sequence, wherein the first and third poles having a coil wound thereon. A rotor of the motor includes fourth and fifth poles disposed in the plane, the rotor being constructed and arranged to be linearly movable in two dimensions when the first, second and third poles of the fixed stator become energized in response to the coils wound on the first and third poles being energized in a temporal sequence. The fourth and fifth poles of the rotor are disposed opposite the first, second and third poles of the fixed stator which is arranged to be fixed relative to the rotor. The rotor may be coupled to a finger such that the position of the finger can be controlled in response to adjusting of a current in each of the coils in micro steps. Current in the coils may be adjusted with sine cosine microstepping.

An embodiment of the invention is directed to an illumination irregularity correction system (IICS) located at a plane configured to receive a substantially constant pupil when illuminated with a beam of radiation. The IICS includes a plurality of fingers configured to be movable into and out of intersection with a radiation beam so as to correct an intensity of respective portions of the radiation beam. A plurality of actuating devices coupled to corresponding ones of the fingers are configured and arranged to move the corresponding fingers. An actuating device includes a fixed stator including first, second and third poles disposed on a plane in a spatial sequence. The first and third poles having a coil wound thereon. The actuating device also includes a rotor having fourth and fifth poles disposed in the plane. The rotor is constructed and arranged to be linearly movable in two dimensions when the first, second and third poles of the fixed stator become energized in response to the coils wound on the first and third poles being energized in a temporal sequence. The fourth and fifth poles of the rotor are disposed opposite the first, second and third poles and the fixed stator is constructed and arranged to be fixed relative to the rotor. The rotor may be constructed and arranged to position at least one finger in response to adjusting of a current in each of the coils in micro steps. Current in the each of the coils may be adjusted with sine cosine microstepping.

An embodiment of the invention provides a method for correcting illumination irregularity in a radiation beam of a lithography system. An IICS is located at a plane and is configured to receive a substantially constant pupil when illuminated with a beam of radiation. A plurality of fingers are provided and configured to be movable into and out of intersection with the radiation beam so as to correct an intensity of respective portions of the radiation beam. A plurality of actuating devices are coupled to corresponding ones of the fingers, the plurality of actuating devices being configured to move the corresponding fingers. An actuation device is configured to have a fixed stator including first, second and third poles disposed on a plane in a spatial sequence, wherein the first and third poles having a coil wound thereon. A rotor includes fourth and fifth poles disposed in the plane, the rotor is constructed and arranged to be linearly movable in two dimensions when the first, second and third poles of the fixed stator become energized in response to the coils wound on the first and third poles being energized in a temporal sequence. The fourth and fifth poles are disposed opposite the first, second and third poles. The fixed stator is constructed and arranged to be fixed relative to the rotor. Current may be adjusted in each of the coils in micro steps to cause the rotor to position at least one finger of the fingers in response to the adjusting of the current. Adjusting a current in each of the coils in micro steps may include adjusting the current in the each of the coils with sine cosine microstepping.

An embodiment of the invention is directed to a linear switched reluctance motor. A stator has a fixed coil arrangement, the stator including at least two poles disposed on a plane in a spatial sequence. A rotor includes at least one pole disposed in the plane, the rotor being constructed and arranged to be linearly movable in two dimensions by the fixed coil arrangement. The stator is constructed and arranged to remain stationary relative to the rotor. The rotor pole is disposed opposite the stator's two poles. The fixed coil arrangement may further include a coil wound on each of the two poles.

An embodiment of the invention provides a lithographic apparatus including an illumination system configured to condition a beam of radiation. A support structure is configured and arranged to hold a patterning device which is configured to pattern the conditioned beam of radiation. A substrate table is configured to hold a substrate on which lithography is to be performed. A projection system is configured and arranged to project the patterned radiation beam onto a target portion of the substrate. An optical system is located within the illumination system and includes an actuation device. The actuation device includes a fixed stator having first, second and third poles disposed on a plane in a spatial sequence, wherein the first and third poles having a coil wound thereon. A rotor includes fourth and fifth poles disposed in the plane, the rotor being constructed and arranged to be linearly movable in two dimensions when the first, second and third poles of the fixed stator become energized in response to the coils wound on the first and third poles being energized in a temporal sequence, wherein the fourth and fifth poles of the rotor are disposed opposite the first, second and third poles of the stator and the fixed stator is constructed and arranged to be fixed relative to the rotor.

An embodiment of the invention provides a lithographic apparatus including an illumination system configured to condition a beam of radiation. A support structure is configured to hold a patterning device, the patterning device being configured and arranged to pattern the conditioned beam of radiation. A substrate table is arranged to hold a substrate on which lithography is to be performed. A projection system is configured and arranged to project the patterned radiation beam onto a target portion of the substrate. An optical system is located within the projection system. The optical system includes an actuation device. The actuation devices includes a fixed stator having first, second and third poles disposed on a plane in a spatial sequence, wherein the first and third poles having a coil wound thereon. A rotor includes fourth and fifth poles disposed in the plane, the rotor being constructed and arranged to be linearly movable in two dimensions when the first, second and third poles of the fixed stator become energized in response to the coils wound on the first and third poles being energized in a temporal sequence. The fourth and fifth poles of the rotor are disposed opposite the first, second and third poles of the stator. The stator is constructed and arranged to be fixed relative to the rotor. Some of the embodiments will be described with respect to drawings below.

Figure 6:
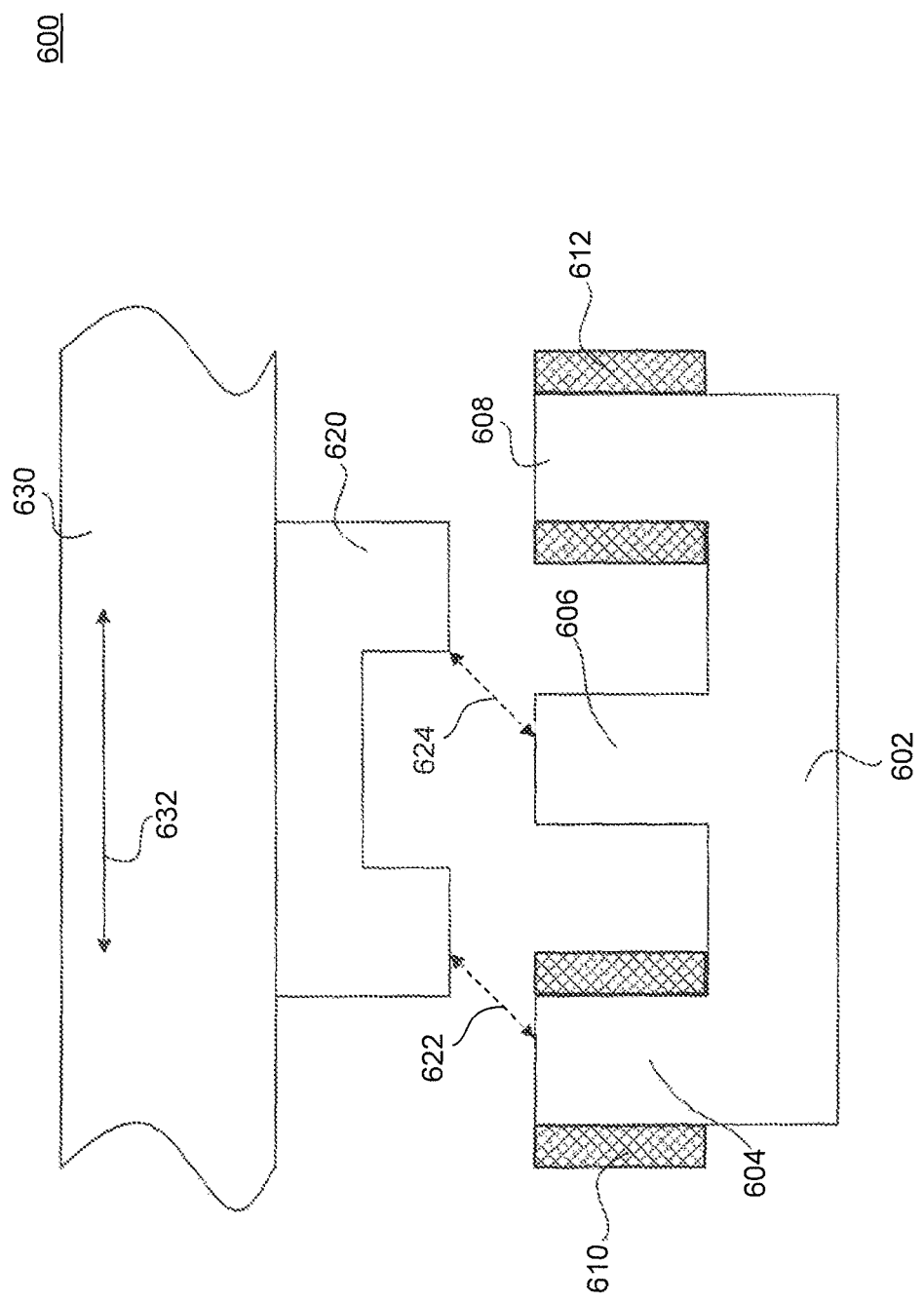
FIG. 6 is a schematic diagram of an embodiment of a linear motor arrangement that can be substituted for a portion of the compensator sub-system shown in FIGS. 3 and 4.

FIG. 6 is a schematic diagram of an embodiment of a linear motor arrangement that can be substituted for a portion of the compensator sub-system shown in FIGS. 3 and 4. An iron "stator" 602 has three poles 604, 606, 608 and two coils 610, 612. A movable iron "rotor" 620 is positioned based on forces 622, 624 controlled by energizing coils 610 and 612. By adjusting the current in each of coils 610 and 612 the position of rotor 620 can be accurately controlled. This can be done with "sine cosine micro stepping" a rotary stepper motor. In turn, the position of a finger body 630, attached to rotor 620 can be controlled to move along a direction indicated by arrow 632. This configuration is determined primarily by existing packaging of an assembly intended for a current design EUV lithography apparatus having a short +/−3 mm travel achieved within one "step." Other configurations are possible. This configuration shown and described above eliminates the need for a finger body to wrap around a coil plate (as in the FIG. 3 and FIG. 4 arrangements and allows a thick coil plate with embedded water cooling. This configuration can be used in other lithography modules as well to eliminate magnets from within an H2 environment.

By placing a current in coil 610 in a given direction, say clockwise and a current in coil 612 in the opposite direction, say counterclockwise, a magnetic flux will be driven through the poles of stator 602 and through the poles of rotor 620. This will apply a force on rotor 620 to align its poles with the poles of stator 602, effectively driving finger body 630. Applying current in opposite directions drive the finger body in the opposite direction.

Figure 7:
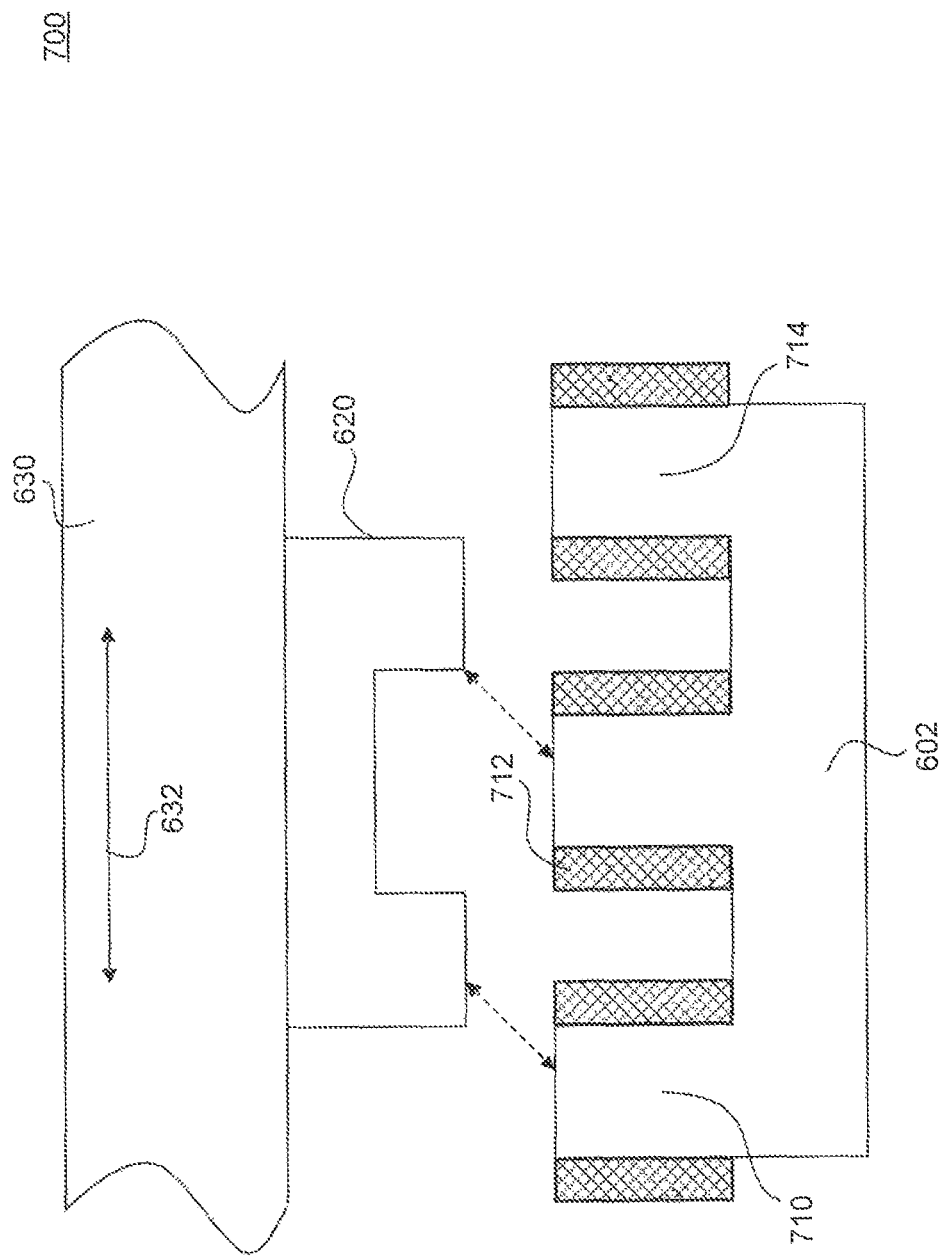
FIG. 7 is a schematic diagram of an embodiment of a linear motor arrangement that can be substituted for a portion of the compensator sub-system shown in FIGS. 3 and 4.

FIG. 7 is a schematic diagram of another embodiment of a linear motor arrangement that can be substituted for a portion of the compensator sub-system shown in FIGS. 3 and 4. This embodiment is similar to the embodiment shown in FIG. 6, but has three coils 710, 712 and 714 rather than only two. The use of an additional coil provides a finer control over the position of rotor 620 and therefore finger body 630.

This principle of operation of the embodiments shown in FIGS. 6 and 7 apply to many configurations including a two pole rotor paired with a two pole, single coil stator which can only apply a force in one direction (e.g. to position a finger body against a spring).

Figure 8:
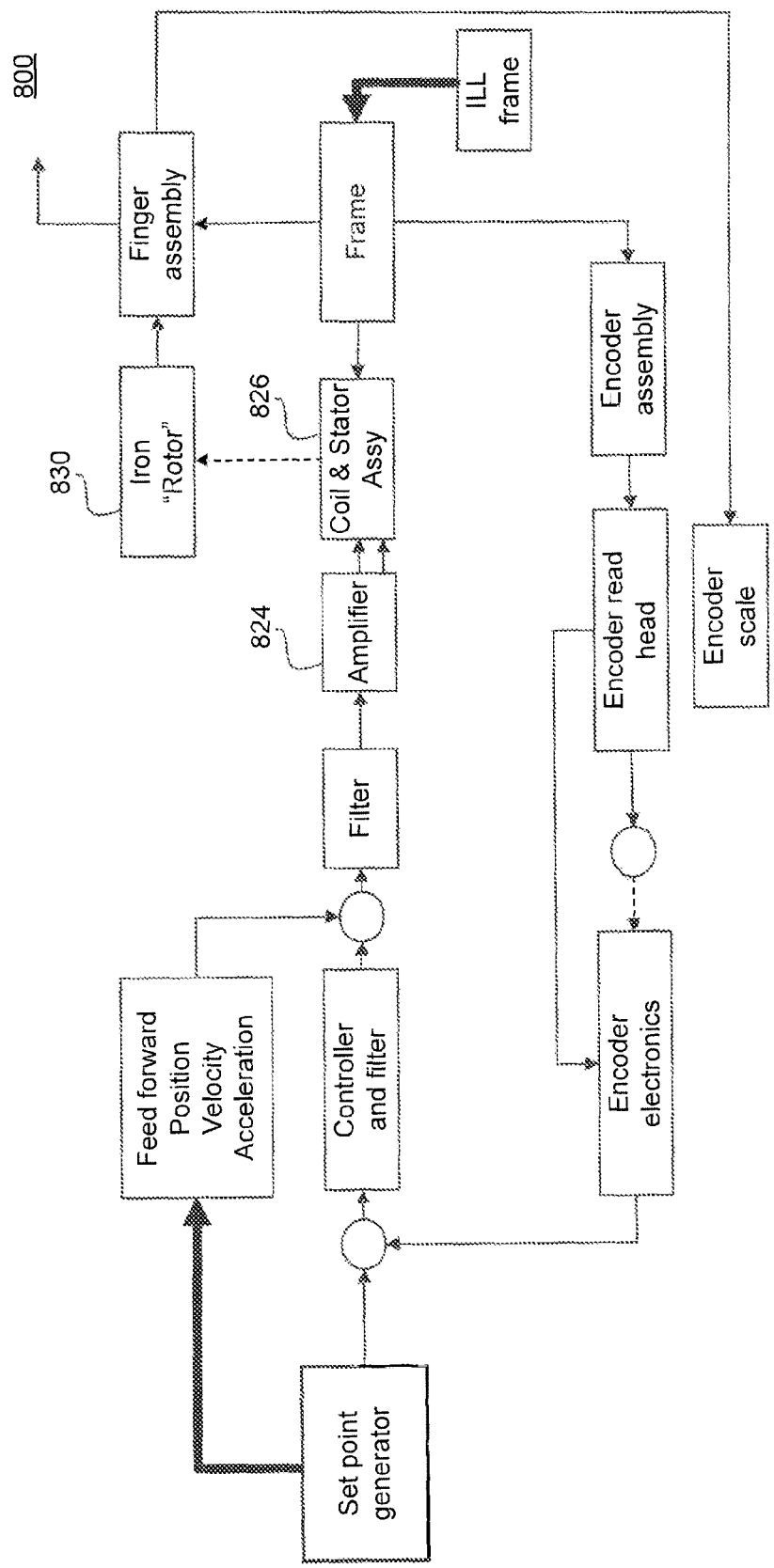
FIG. 8 is a block diagram of a control system for operating the compensator sub-system including the embodiments shown in FIGS. 6 and 7.

FIG. 8 is a block diagram of a control system 800 for operating an IIC sub-system including the embodiments shown in FIGS. 6 and 7. As in FIG. 5, physical connections or software relations are indicated by a solid line arrow. Virtual relations are indicated by a dotted line arrow. With respect to control system 500 shown in FIG. 5, TAPA 524 is replaced by an amplifier 824, coil plate 526 is replaced by coil and stator assembly, and magnet assembly 530 is replaced by iron "rotor" 830. In other respects, the servo system operates in a similar fashion to that of servo system 500 shown in FIG. 5. The blocks of control system 800 cooperate to form a module constructed and arranged to set a desired position of a finger; a module constructed and arranged to sense a present position of the finger; and a module constructed and arranged to generate currents appropriate to control the position of the finger such that it is positioned at the desired position.

Figure 9:
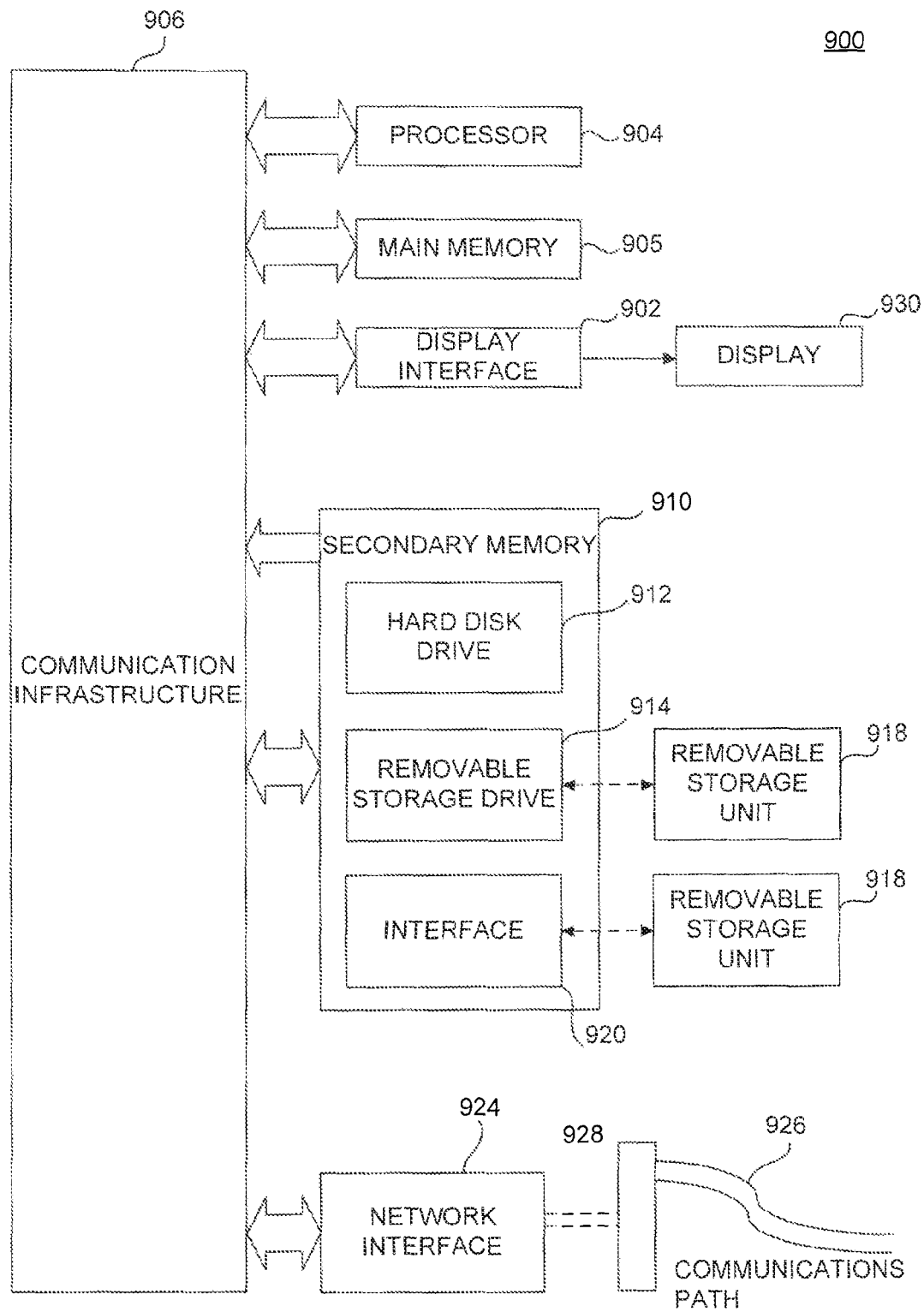
FIG. 9 is an illustration of an example computer system 1500 in which embodiments of the present invention, or portions thereof, can be implemented as computer-readable code.

FIG. 9 is an illustration of an example computer system 900 in which embodiments of the present invention, or portions thereof, can be implemented as computer-readable code. The control arrangements and methods illustrated in FIGS. 5 and 8 can be implemented as computer-readable code. They can also be implemented in computer system 900 that includes a display interface 902 coupled to a display 930. Various embodiments of the invention are described in terms of this example computer system 900. After reading this description, it will become apparent to a person skilled in the relevant art how to implement embodiments of the invention using other computer systems and/or computer architectures.

Computer system 900 includes one or more processors, such as processor 904. Processor 904 may be a special purpose or a general purpose processor. Processor 904 is connected to a communication infrastructure 906 (e.g., a bus or network).

Computer system 900 also includes a main memory 905, preferably random access memory (RAM), and may also include a secondary memory 910. Secondary memory 910 can include, for example, a hard disk drive 912, a removable storage drive 914, and/or a memory stick. Removable storage drive 914 can comprise a floppy disk drive, a magnetic tape drive, an optical disk drive, a flash memory, or the like. The removable storage drive 914 reads from and/or writes to a removable storage unit 918 in a well-known manner. Removable storage unit 918 can include a floppy disk, magnetic tape, optical disk, etc. which is read by and written to by removable storage drive 914. As will be appreciated by persons skilled in the relevant art, removable storage unit 918 includes a computer-usable storage medium having stored therein computer software and/or data.

In alternative implementations, secondary memory 910 can include other similar devices for allowing computer programs or other instructions to be loaded into computer system 900. Such devices can include, for example, a removable storage unit 918 and an interface 920. Examples of such devices can include a program cartridge and cartridge interface (such as those found in video game devices), a removable memory chip (e.g., EPROM or PROM) and associated socket, and other removable storage units 918 and interfaces 920 which allow software and data to be transferred from the removable storage unit 918 to computer system 900.

Computer system 900 can also include a communications interface 924. Communications interface 924 allows software and data to be transferred between computer system 900 and external devices. Communications interface 924 can include a modem, a network interface (such as an Ethernet card), a communications port, a PCMCIA slot and card, or the like. Software and data transferred via communications interface 924 are in the form of signals, which may be electronic, electromagnetic, optical, or other signals capable of being received by communications interface 924. These signals are provided to communications interface 924 via a communications path 926 and 928. Communications path 926 and 928 carries signals and may be implemented using wire or cable, fiber optics, a phone line, a cellular phone link, a RF link or other communications channels.

In this document, the terms "computer program medium" and "computer-usable medium" are used to generally refer to media such as removable storage unit 918, removable storage unit 918, and a hard disk installed in hard disk drive 912. Computer program medium and computer-usable medium can also refer to memories, such as main memory 905 and secondary memory 910, which can be memory semiconductors (e.g., DRAMs, etc.). These computer program products provide software to computer system 900.

Computer programs (also called computer control logic) are stored in main memory 905 and/or secondary memory 910. Computer programs may also be received via communications interface 924. Such computer programs, when executed, enable computer system 900 to implement embodiments of the present invention as discussed herein. In particular, the computer programs, when executed, enable processor 904 to implement processes of the present invention, discussed above. Accordingly, such computer programs represent controllers of the computer system 900. Where embodiments of the invention are implemented using software, the software can be stored in a computer program product and loaded into computer system 900 using removable storage drive 914, interface 920, hard drive 912 or communications interface 924.

Embodiments of the invention are also directed to computer program products including software stored on any computer-usable medium. Such software, when executed in one or more data processing device, causes a data processing device(s) to operate as described herein. Embodiments of the invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, Nano technological storage devices, etc.), and communication mediums (e.g., wired and wireless communications networks, local area networks, wide area networks, intranets, etc.).

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic apparatus comprising:
   an illumination system configured to condition a beam of radiation;
   a support structure configured to hold a patterning device, the patterning device configured to pattern the conditioned beam of radiation;
   a substrate table configured to hold a substrate;
   a projection system configured to project the patterned radiation beam onto a target portion of the substrate; and
   an illumination irregularity correction system located at a plane configured to receive a substantially constant pupil when illuminated with the beam of radiation, the uniformity correction system including fingers configured to be movable into and out of intersection with a radiation beam so as to correct an intensity of respective portions of the radiation beam, and actuating devices coupled to corresponding ones of the fingers and configured to move the corresponding fingers, an actuation device including:
   a fixed stator including first, second and third poles disposed on a plane in a spatial sequence, wherein the first and third poles having a coil wound thereon; and
   a rotor including fourth and fifth poles disposed in the plane, the rotor constructed and arranged to be linearly movable in two dimensions when the first, second and third poles of the fixed stator become energized in response to the coils wound on the first and third poles being energized in a temporal sequence, wherein the fourth and fifth poles are disposed opposite the first, second and third poles and the fixed stator is constructed and arranged to be fixed relative to the rotor.

2. The lithography system according to claim 1, wherein the rotor is constructed and arranged to position at least one finger of the fingers in response to adjusting of a current in each of the coils in micro steps.

3. The lithography system according to claim 2, wherein the current in the each of the coils is adjusted with sine cosine microstepping.

4. The lithography system according to claim 1, wherein the fixed stator are made of iron.

5. The lithography system according to claim 1, further comprising a servo control system constructed and arranged to control the actuating devices, the servo control system comprising:
 a module constructed and arranged to set a desired position of a finger;
 a module constructed and arranged to sense a present position of the finger; and
 a module constructed and arranged to generate currents appropriate to control the position of the finger such that it is positioned at the desired position.

6. An illumination irregularity correction system located at a plane configured to receive a substantially constant pupil when illuminated with a beam of radiation, the uniformity correction system comprising:
 a plurality of fingers configured to be movable into and out of intersection with a radiation beam so as to correct an intensity of respective portions of the radiation beam; and
 a plurality of actuating devices coupled to corresponding ones of the fingers and configured to move the corresponding fingers, an actuation device including:
 a fixed stator including first, second and third poles disposed on a plane in a spatial sequence, wherein the first and third poles having a coil wound thereon; and
 a rotor including fourth and fifth poles disposed in the plane, the rotor constructed and arranged to be linearly movable in two dimensions when the first, second and third poles of the fixed stator become energized in response to the coils wound on the first and third poles being energized in a temporal sequence, wherein the fourth and fifth poles are disposed opposite the first, second and third poles and the fixed stator is constructed and arranged to be fixed relative to the rotor.

7. The illumination irregularity correction system according to claim 6, wherein the rotor is constructed and arranged to position at least one finger of the fingers in response to adjusting of a current in each of the coils in micro steps.

8. The illumination irregularity correction system according to claim 7, wherein the current in the each of the coils is adjusted with sine cosine microstepping.

9. A method for correcting illumination irregularity in a radiation beam of a lithography system, the method comprising:
 locating at a plane an illumination irregularity correction system, the illumination irregularity correction system configured to receive a substantially constant pupil when illuminated with a beam of radiation;
 providing a plurality of fingers configured to be movable into and out of intersection with the radiation beam so as to correct an intensity of respective portions of the radiation beam; and
 coupling a plurality of actuating devices to corresponding ones of the fingers, the plurality of actuating devices configured to move the corresponding fingers, wherein an actuation device including:
 a fixed stator including first, second and third poles disposed on a plane in a spatial sequence, wherein the first and third poles having a coil wound thereon; and
 a rotor including fourth and fifth poles disposed in the plane, the rotor constructed and arranged to be linearly movable in two dimensions when the first, second and third poles of the fixed stator become energized in response to the coils wound on the first and third poles being energized in a temporal sequence, wherein the fourth and fifth poles are disposed opposite the first, second and third poles and the fixed stator is constructed and arranged to be fixed relative to the rotor.

10. The method according to claim 9, further comprising:
 adjusting a current in each of the coils in micro steps to cause the rotor to position at least one finger of the fingers in response to the adjusting of the current.

11. The method according to claim 10, wherein adjusting a current in each of the coils in micro steps further comprising:
 adjusting the current in the each of the coils with sine cosine microstepping.

12. A lithographic apparatus comprising:
 an illumination system configured to condition a beam of radiation;
 a support structure configured to hold a patterning device, the patterning device configured to pattern the conditioned beam of radiation;
 a substrate table configured to hold a substrate;
 a projection system configured to project the patterned radiation beam onto a target portion of the substrate; and
 an optical system located within the illumination system, the optical system including an actuation device including:
 a fixed stator including first, second and third poles disposed on a plane in a spatial sequence, wherein the first and third poles having a coil wound thereon; and
 a rotor including fourth and fifth poles disposed in the plane, the rotor constructed and arranged to be linearly movable in two dimensions when the first, second and third poles of the fixed stator become energized in response to the coils wound on the first and third poles being energized in a temporal sequence, wherein the fourth and fifth poles are disposed opposite the first, second and third poles and the fixed stator is constructed and arranged to be fixed relative to the rotor.

13. A lithographic apparatus comprising:
 an illumination system configured to condition a beam of radiation;
 a support structure configured to hold a patterning device, the patterning device configured to pattern the conditioned beam of radiation;
 a substrate table configured to hold a substrate;
 a projection system configured to project the patterned radiation beam onto a target portion of the substrate; and
 an optical system located within the projection system, the optical system including an actuation device including:
 a fixed stator including first, second and third poles disposed on a plane in a spatial sequence, wherein the first and third poles having a coil wound thereon; and
 a rotor including fourth and fifth poles disposed in the plane, the rotor constructed and arranged to be linearly movable in two dimensions when the first, second and third poles of the fixed stator become energized in response to the coils wound on the first and third poles being energized in a temporal sequence, wherein the fourth and fifth poles are disposed opposite the first, second and third poles and the fixed stator is constructed and arranged to be fixed relative to the rotor.

* * * * *